(12) United States Patent
Komori et al.

(10) Patent No.: US 8,241,951 B2
(45) Date of Patent: Aug. 14, 2012

(54) METHOD OF MANUFACTURING SOLID-STATE IMAGE PICKUP DEVICE AND SOLID-STATE IMAGE PICKUP DEVICE

(75) Inventors: Hisatane Komori, Ayase (JP); Koji Tsuduki, Kawasaki (JP); Yasuhiro Matsuki, Atsugi (JP); Satoru Hamasaki, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 314 days.

(21) Appl. No.: 12/640,156

(22) Filed: Dec. 17, 2009

(65) Prior Publication Data

US 2010/0155869 A1    Jun. 24, 2010

(30) Foreign Application Priority Data

Dec. 19, 2008  (JP) ................................ 2008-324403

(51) Int. Cl.
*H01L 21/00* (2006.01)
(52) U.S. Cl. ........ 438/106; 438/116; 438/121; 257/684; 257/E23.001
(58) Field of Classification Search .................. 257/678, 257/680, 684, 729, 730, E23.001; 438/106, 438/116, 121
See application file for complete search history.

(56) References Cited

U.S. PATENT DOCUMENTS

2003/0122137 A1*  7/2003  Hashimoto ..................... 257/80
2008/0186572 A1*  8/2008  Tomikawa et al. ............. 359/462

FOREIGN PATENT DOCUMENTS

JP           7202152 A    8/1995
JP      2004-134672 A    4/2004

* cited by examiner

*Primary Examiner* — Benjamin Sandvik
*Assistant Examiner* — Scott R Wilson
(74) *Attorney, Agent, or Firm* — Canon U.S.A., Inc. IP Division

(57) ABSTRACT

A method includes preparing a cover member; preparing an image pickup element including a substrate including a pixel region including a plurality of photo detectors on a principal surface, a first concavo-convex portion including a plurality of first convex portions configured to concentrate light on the plurality of photo detectors, the first convex portions each having a lens shape, and a second concavo-convex portion surrounding the first concavo-convex portion, the second concavo-convex portion including a plurality of second convex portions; and fixing the cover member to a region of the image pickup element using a fixing member, the region being between the first concavo-convex portion and the second concavo-convex portion.

26 Claims, 9 Drawing Sheets

METHOD OF MANUFACTURING SOLID-STATE IMAGE PICKUP DEVICE AND SOLID-STATE IMAGE PICKUP DEVICE

BACKGROUND OF THE INVENTION

1. Field of the Invention

The present invention relates to a method of manufacturing a solid-state image pickup device. In particular, the present invention relates to a method of manufacturing a solid-state image pickup device, the solid-state image pickup device including a cover member fixed to a photo detector.

2. Description of the Related Art

In recent years, a reduction in the size and thickness of solid-state image pickup devices has been demanded, as digital cameras and mobile phones have been reduced in size and thickness.

Japanese Patent Laid-Open No. 7-202152 discloses a solid-state image pickup device including a solid-state image pickup element chip and a cover member hermetically sealing the chip. The cover member, which is made of a transparent material, includes a frame portion that is integrally formed on edges of the lower surface of the cover member. Japanese Patent Laid-Open No. 2004-134672 discloses a solid-state image pickup device including a solid-state image pickup element and a transparent substrate mounted thereon with a sealing agent.

These devices include microlenses formed on a photo detector side of the solid-state image pickup element, each of the microlenses corresponding to a pixel and being constituted by a convex portion having a height of several micrometers. In recent years, reduction in the area of a region outside the pixel region of the solid-state image pickup element has been demanded so as to reduce the size of the chip and the size of the package of the solid-state image pickup element. However, when a sealing agent is used to mount a transparent substrate on a solid-state image pickup element having microlenses on the photo detector side thereof, the sealing agent may contact the microlenses. If the sealing agent contacts the microlenses, the sealing agent may infiltrate into spaces between the convex portions that constitute the microlenses due to capillary action and may reach the pixel region, which may cause degradation of the optical properties.

SUMMARY OF THE INVENTION

According to an aspect of the present invention, a method includes preparing a cover member; preparing an image pickup element including a substrate including a pixel region including a plurality of photo detectors on a principal surface, a first concavo-convex portion including a plurality of first convex portions configured to concentrate light on the plurality of photo detectors, the convex portions each having a lens shape, and a second concavo-convex portion surrounding the first concavo-convex portion, the second concavo-convex portion including a plurality of second convex portions; and fixing the cover member to a region of the image pickup element using a fixing member, the region being between the first concavo-convex portion and the second concavo-convex portion.

Further features of the present invention will become apparent from the following description of exemplary embodiments with reference to the attached drawings.

DESCRIPTION OF THE EMBODIMENTS

Hereinafter, a method of manufacturing a solid-state image pickup device and a solid-state image pickup device according to embodiments of the present invention are described with reference to the drawings. However, the present invention is not limited to the embodiments.

Referring to FIG. 1, a method of manufacturing a solid-state image pickup device according to a first embodiment of the present invention is described.

Figure 1A:
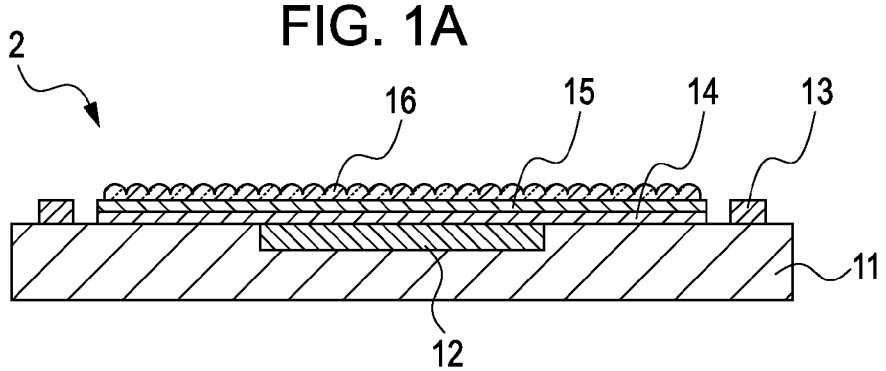
FIGS. 1A to 1D are sectional views illustrating a method of manufacturing a solid-state image pickup device according to an embodiment of the present invention.

FIG. 1A is a sectional view illustrating a step of preparing a solid-state image pickup element 2, the step being included in the method of manufacturing a solid-state image pickup device 1 according to the first embodiment. As illustrated in FIG. 1A, the solid-state image pickup element 2 includes a substrate 11, a pixel region 12, and terminals 13. The pixel region 12 includes a plurality of photo detectors disposed on a principal surface of the substrate 11. The solid-state image pickup element 2 further includes a color filter 14 disposed on the pixel region, a planarization layer 15 disposed on the color filter, and convex portions that constitute microlenses 16 disposed on the planarization layer. The substrate 11 is a silicon substrate or the like. The pixel region 12, which is formed on the principal surface of the substrate 11, includes a plurality of pixels constituted by a plurality of photo detectors and switches, such as a CCD sensor or a CMOS sensor. In this document, the pixel region 12 refers to pixels used for forming an image. The color filter 14 is disposed on the principal surface of the substrate 11 including the pixel region 12. Colors of red, green, and blue (RGB) are arranged on the color filter 14 at positions corresponding to the pixels using photolithography. The planarization layer 15 is disposed on the color filter so that the microlenses 16 can be uniformly formed thereon. The microlenses 16 on the planarization layer are made by forming a transparent layer using photolithography, patterning the layer by etching in accordance with pixels, melting and heating the layer by a method such as reflowing, and providing lens shapes by the action of surface tension. The microlenses serve to concentrate incident light on the photo detectors. The microlenses 16 may be made by bonding a microlens array to the substrate 11, the microlens array being formed by a nanoimprinting process with which lens shapes are transferred on a resin layer with a mold.

Nanoimprinting permits a relatively wide choice of shape for the convex portions, so that the convex portions having a high aspect ratio can be formed.

Figure 1B:
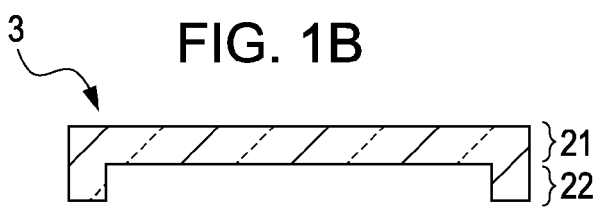

FIG. 1B is a sectional view illustrating a step of preparing a cover member 3, the step being included in the method of manufacturing the solid-state image pickup device 1. As illustrated in FIG. 1B, the cover member 3 includes a flat panel portion 21 and a frame portion 22 that are integrally formed, and a depression formed by these portions. The cover member 3 is made of glass, resin, or quartz. The cover member 3 may have an integral structure or an assembly structure. The integral structure can be made by polishing, etching, and molding a panel made of glass or resin so as to form the flat panel portion 21, the frame portion 22, and a depression. The assembly structure can be made by attaching a flat transparent panel made of glass or resin to a frame that is a different member. In the case of the assembly structure, the frame portion may be made of metal. In order to improve the optical properties, an anti-reflection coating or an IR coating may be applied to the back surface of the flat panel portion 21. In order to achieve a fine image, entry of reflected light from the frame portion 22 into the pixel region 12 is to be prevented. Therefore, the frame portion 22 may be made of a material having an index of refraction close to that of air (1), or a material having a high light absorptivity. An anti-reflection coating and an IR coating may be applied to an inner wall or an outer wall of the frame portion 22, as with the flat panel portion 21.

Figure 1C:
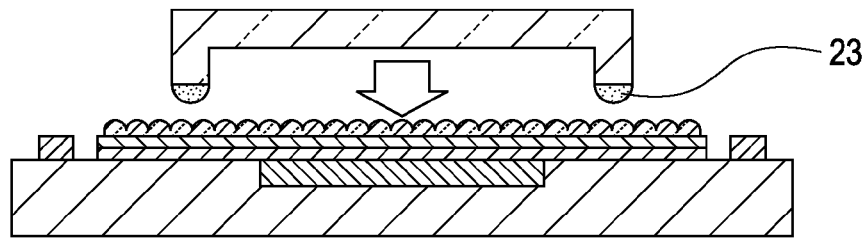

FIG. 1C is a sectional view illustrating a step of bonding the cover member 3 to the solid-state image pickup element 2 with a fixing member 23 that is uncured, the step being included in the method of manufacturing the solid-state image pickup device 1. Uncured adhesive serving as the fixing member 23 is applied to the solid-state image pickup element side of the frame portion of the cover member 3, and the cover member 3 is pressed against the solid-state image pickup element 2.

Figure 1D:
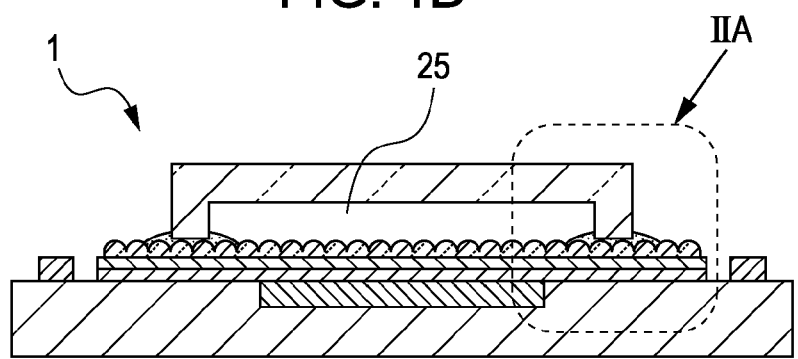

FIG. 1D is a sectional view illustrating a state in which the adhesive serving as the fixing member 23 is spread over the solid-state image pickup element during the step of bonding illustrated in FIG. 1C. A space 25 is formed between the solid-state image pickup element 2 and the cover member 3. Subsequently, the adhesive is cured.

Figure 2A:
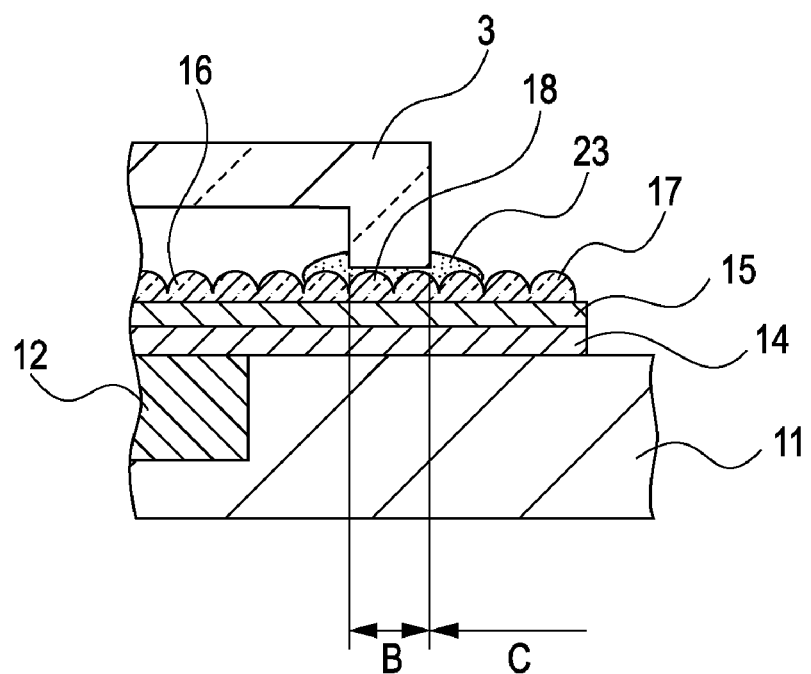
FIG. 2A is an enlarged sectional view.
Figure 2B:
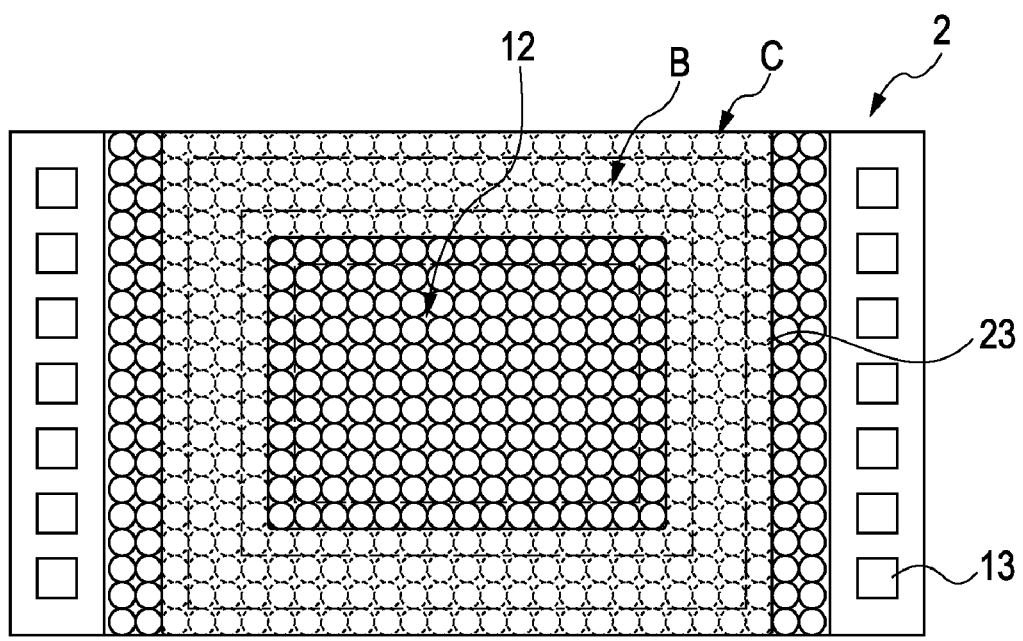
FIG. 2B is a plan view of a solid-state image pickup device according to an embodiment of the present invention.

FIG. 2A is an enlarged sectional view of the solid-state image pickup device 1 illustrating an area defined by line IIA of FIG. 1D. FIG. 2B is a plan view of the solid-state image pickup device 1 of FIG. 1D.

In the solid-state image pickup device 1 illustrated in FIGS. 2A and 2B, a fixing region B of the solid-state image pickup element 2 faces the frame portion 22 of the cover member 3. Inside the fixing region B, the pixel region 12 of the solid-state image pickup element 2 is disposed, and the microlenses 16 are disposed on the solid-state image pickup element 2. A first concavo-convex portion 16 refers to convex portions that constitute the microlenses 16 that are inside the fixing region B and that face at least the pixel region 12. Members similar to the microlenses 16 are disposed on the solid-state image pickup element 2 in a region C outside the fixing region B. A second concavo-convex portion 17 refers to convex portions that constitute the members having microlens shapes disposed in the region C. That is, the fixing region B is a region between the first concavo-convex portion and the second concavo-convex portion. The cover member is mounted on the fixing region B of the solid-state image pickup element with an adhesive. In the present embodiment, members having microlens shapes are disposed also in fixing region B, so that the members having the microlens shapes are disposed continuously from the inside to the outside of the fixing region B in an integral form. A third concavo-convex portion 18 refers to convex portions that constitute the microlenses in the fixing region. If, for example, the microlenses are disposed only inside the fixing region, the fixing member 23 may contact the first concavo-convex portion 16 and infiltrate into the pixel region 12. In order to prevent the fixing member 23 from contacting the first concavo-convex portion 16, the distance between the first concavo-convex portion 16 and the frame portion 22 has to be large. That is, the first concavo-convex portion 16 has to be disposed away from the frame portion 22 so that the fixing member 23 may not contact the first concavo-convex portion 16. With such configuration, however, the solid-state image pickup device cannot be reduced in size.

In contrast, with the configuration of the present embodiment, an adhesive serving as the fixing member 23 infiltrates into a region inside (the pixel region side) the fixing region and into the region C outside the fixing region. Thus, infiltration of the fixing member 23 into a region corresponding to the pixel region 12 is suppressed, whereby the solid-state image pickup device can be reduced in size. That is, capillary action in the second and third concavo-convex portions serves to suppress infiltration of the fixing member into the first concavo-convex portion. The second concavo-convex portion may be formed such that capillary action allows the adhesive to infiltrate thereinto with a force stronger than that of the first concavo-convex portion. In the present embodiment, the second concavo-convex portion and the third concavo-convex portion include members having microlens shapes similar to those of the first concavo-convex portion. However, the members in the second and third concavo-convex portions may have any shapes as long as capillary action occurs.

The microlenses are disposed from the pixel region to a region outside the region to which the frame portion is fixed. Therefore, when forming the microlenses by heating and melting, the microlenses in the pixel region can be uniformly formed in desirable shapes.

The microlenses are integrally disposed from the pixel region to a region outside the region to which the frame portion is fixed. Therefore, even if detachment occurs at a periphery of the microlenses, deterioration of the optical properties of the pixel region is suppressed because the pixel region is away from the periphery.

Figure 3A:
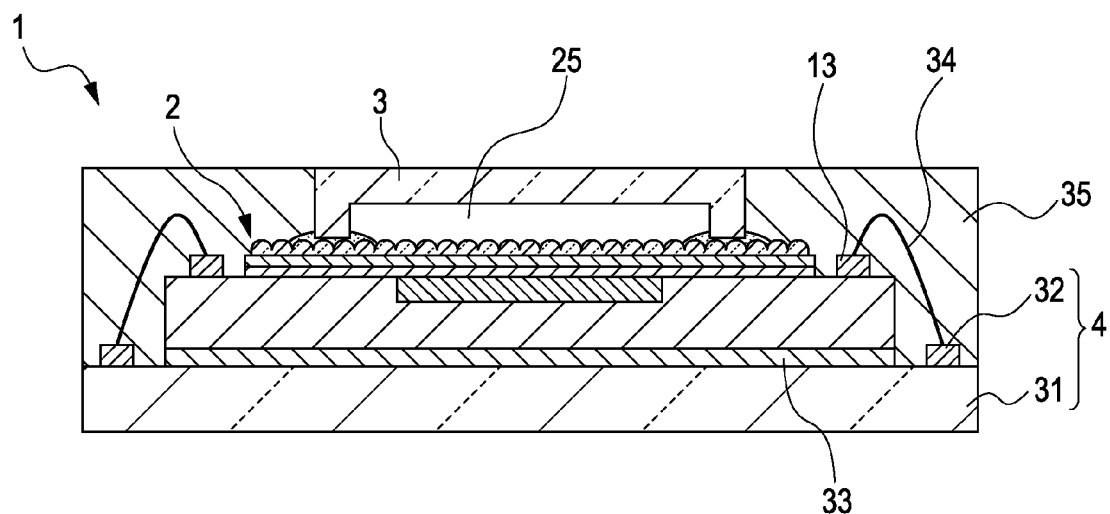
FIG. 3A is a sectional view.
Figure 3B:
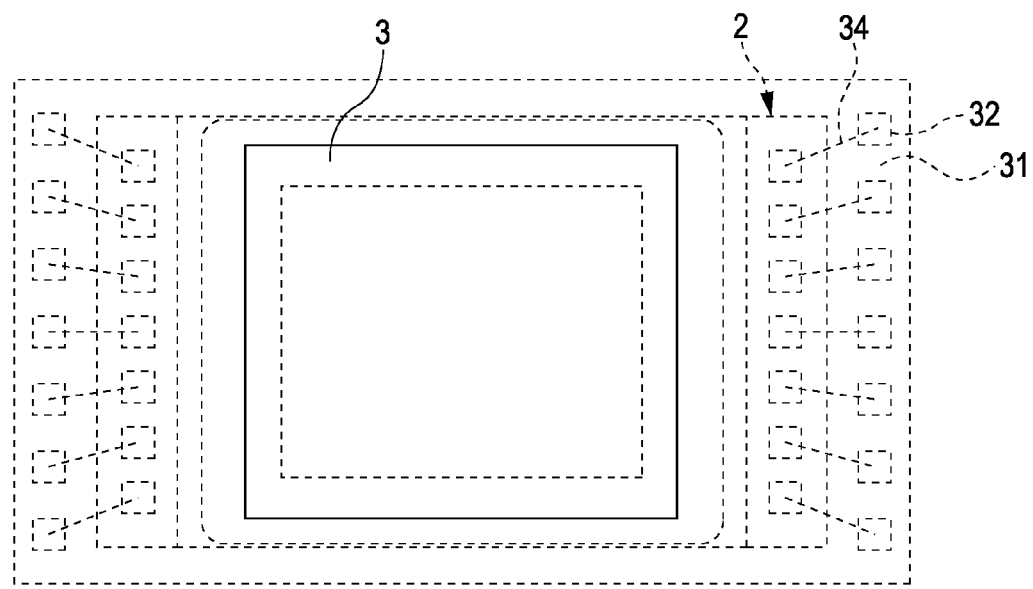
FIG. 3B is a plan view of a solid-state image pickup device according to an embodiment of the present invention.

FIG. 3A is a sectional view, and FIG. 3B is a plan view of the solid-state image pickup device 1 illustrated in FIG. 1D after being packaged. The solid-state image pickup element of the solid-state image pickup device 1 illustrated in the figures is fixed to a wiring substrate 4 on a side opposite the integrated cover member side with a fixing member 33. The terminals 13 of the solid-state image pickup element 2 are connected to terminals 32 of the wiring substrate 4 through conductors such as metal wires. The solid-state image pickup device 1 further includes a sealing member 35 that surrounds and seals the wiring substrate 4, the solid-state image pickup element 2, and the cover member 3. The wiring substrate 4 may be a lead frame, a printed wiring board, a flexible wiring board, or a metal base wiring board. If the wiring substrate 4 is a lead frame, the solid-state image pickup element is fixed to the lead frame with a fixing member. The wiring substrate 4 illustrated in the figure is a printed wiring board. The wiring substrate 4 includes a substrate 31, which is made of ceramic or glass epoxy, and the terminals 32 disposed on the substrate 31. The printed wiring board serving as the wiring substrate 4 includes wiring disposed on or in the substrate 31. A metal wire 34 serving as a conductor is used to transfer signals between the solid-state image pickup element 2 and the wiring substrate 4. With this configuration, infiltration of water into a space in the solid-state image pickup device is further suppressed.

Figure 4:
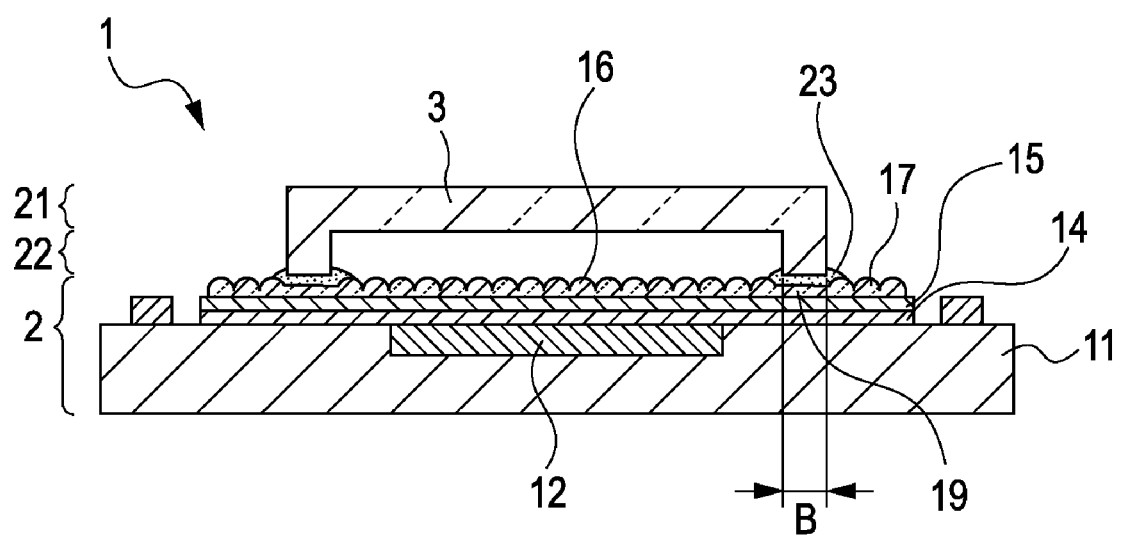
FIG. 4 is a sectional view of a solid-state image pickup device according to an embodiment of the present invention.

Next, a second embodiment is described. FIG. 4 is a sectional view of a solid-state image pickup device according to the second embodiment.

The solid-state image pickup device 1 illustrated in FIG. 4 differs from the solid-state image pickup device of the first embodiment in that the third concavo-convex portion of the solid-state image pickup element 2 that faces the frame portion is planarized. That is, the microlenses are disposed inside (the pixel region side) and outside the fixing region B of the solid-state image pickup element 2, and the microlenses are not disposed in the fixing region facing the frame portion 22. In a method of manufacturing the solid-state image pickup device 1, in the step of preparing the solid-state image pickup element 2, the solid-state image pickup element 2 including the first concavo-convex portion 16, the second concavo-convex portion 17, and a flat portion 19 configured as described above is prepared. With this configuration, an adhesive serving as the fixing member can be infiltrated into a region inside (the pixel region side) the fixing region B and into a region outside the fixing member region. Therefore, infiltration of the fixing member 23 into a region corresponding to the pixel region 12 can be suppressed, so that the solid-state image pickup device 1 can be reduced in size.

The distance between concave portions of the third concavo-convex portion 18 and the frame portion 22 in the solid-state image pickup device 1 illustrated in FIG. 1D may be the same as the distance between the flat portion 19 and the bottom of the frame portion 22 in the solid-state image pickup device 1 illustrated in FIG. 4. In this case, a benefit is obtained in that leakage of the fixing member 23 can be suppressed. This is because the fixing member 23 in the volume of the convex portions of the third concavo-convex portion 18 can be held in the fixing region B.

When the bottom of the frame portion is flat, friction is increased as compared with the case in which the bottom of the frame portion is spherical, whereby displacement of the frame portion is reduced and the position of the frame portion in horizontal directions can be stabilized.

The first concavo-convex portion 16 corresponding to the pixel region 12, the flat portion 19 corresponding to the region to which the frame portion is fixed, and the second concavo-convex portion 17 corresponding to the region outside the frame portion can be formed in the same step. Therefore, a benefit is obtained in that the solid-state image pickup device according to the embodiment can be manufactured without increasing the number of steps and the cost.

Next, a third embodiment is described. FIG. 5 is a sectional view of the solid-state image pickup device according to the third embodiment.

Figure 5A:
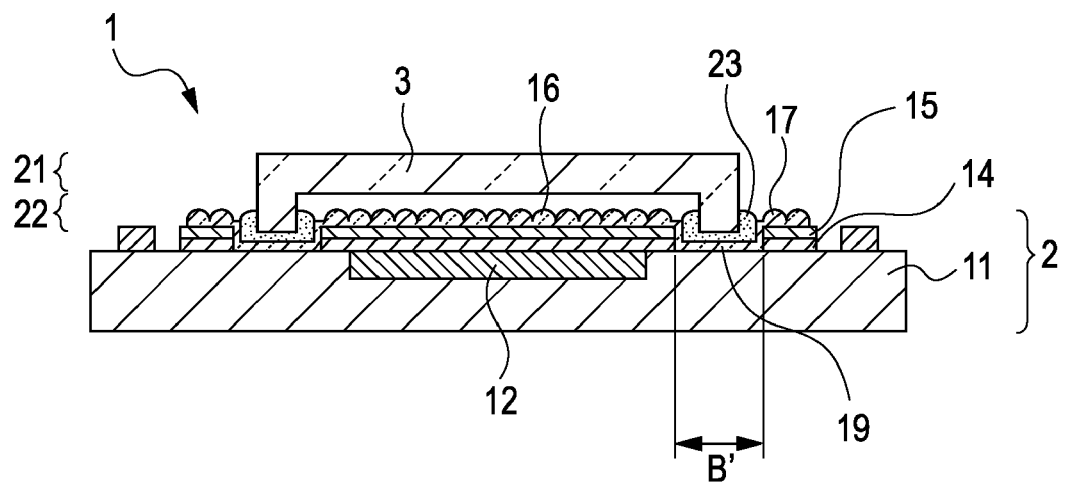
FIGS. 5A and 5B are sectional views of a solid-state image pickup device according to an embodiment of the present invention.
Figure 5B:
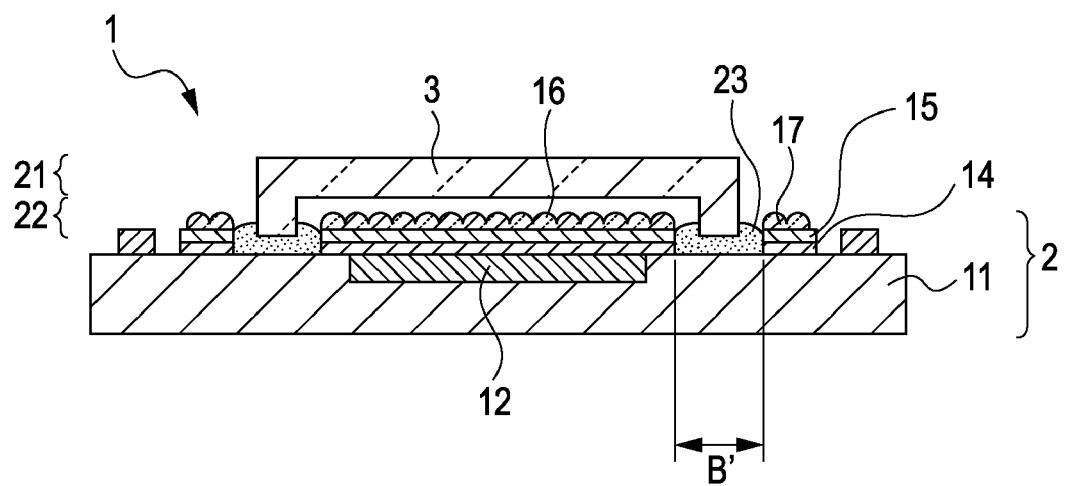

The solid-state image pickup device 1 illustrated in FIG. 5 differs from the solid-state image pickup device 1 of the first embodiment in that the planarization layer and the color filter facing the frame portion are removed from the surface of the solid-state image pickup element. That is, the first concavo-convex portion 16 serving as the microlenses is disposed inside (the pixel region side) the fixing region B' and the second concavo-convex portion 17 is disposed outside the fixing region B', while the first and second concavo-convex portions 16 and 17 are not disposed in the fixing region B' that includes a region of the solid-state image pickup element 2 facing the frame portion 22 and a region adjacent to the frame portion 22. To be more specific, the solid-state image pickup device 1 illustrated in FIG. 5A includes a flat portion in the fixing region B' from which the planarization layer 15 and the color filter 14 on the solid-state image pickup element are removed, and the flat portion is made of the same material as that of the first concavo-convex portion 16 serving as the microlenses. The solid-state image pickup device 1 illustrated in FIG. 5B is configured such that the flat portion in the fixing region B' on the solid-state image pickup element surface is removed from the solid-state image pickup device 1 illustrated in FIG. 5A, the flat portion being made of the same material as that of the microlenses. In a method of manufacturing the solid-state image pickup device 1, in the step of preparing the solid-state image pickup element 2, the solid-state image pickup element 2 including the first concavo-convex portion 16, the second concavo-convex portion 17, and the fixing region B', which are configured as described above, is prepared. To be specific, in the case of FIG. 5A, the color filter 14 and the planarization layer 15 are formed on the substrate, a groove is formed by etching a portion corresponding to the fixing region B' or by cutting the portion with a rotary cutter, and the microlenses are formed. When forming the microlenses, the portion corresponding to the fixing region B' is planarized. In the case of FIG. 5B, after forming the microlenses, the microlenses, the color filter 14, and the planarization layer 15 in the vicinity of a region to which the frame portion 22 of the solid-state image pickup element 2 is fixed are removed by etching or by cutting with a rotary cutter, so that a groove is formed. With this configuration, a fixing member can be infiltrated into regions inside (the pixel region side) and outside the fixing region B'. Thus, infiltration of the fixing member into the pixel region 12 can be suppressed, whereby the solid-state image pickup device can be reduced in size. In the case of FIG. 5A, a material of the microlenses is integrally disposed so as to extend from the pixel region 12 through the groove, which has an anchor effect, to the outside of the cover member 3, whereby detachment of the microlens 16 in the pixel region 12 can be reduced.

The groove in the solid-state image pickup element serves to facilitate the control of position at which the frame portion is placed on the solid-state image pickup element.

As compared with the solid-state image pickup device 1 illustrated in FIGS. 1D and 4, a benefit is obtained in that leakage of the fixing member can be suppressed. This is because the fixing member in the volume of the microlenses, the planarization layer, and the color filter can be held in the fixing region B'.

Figure 6:
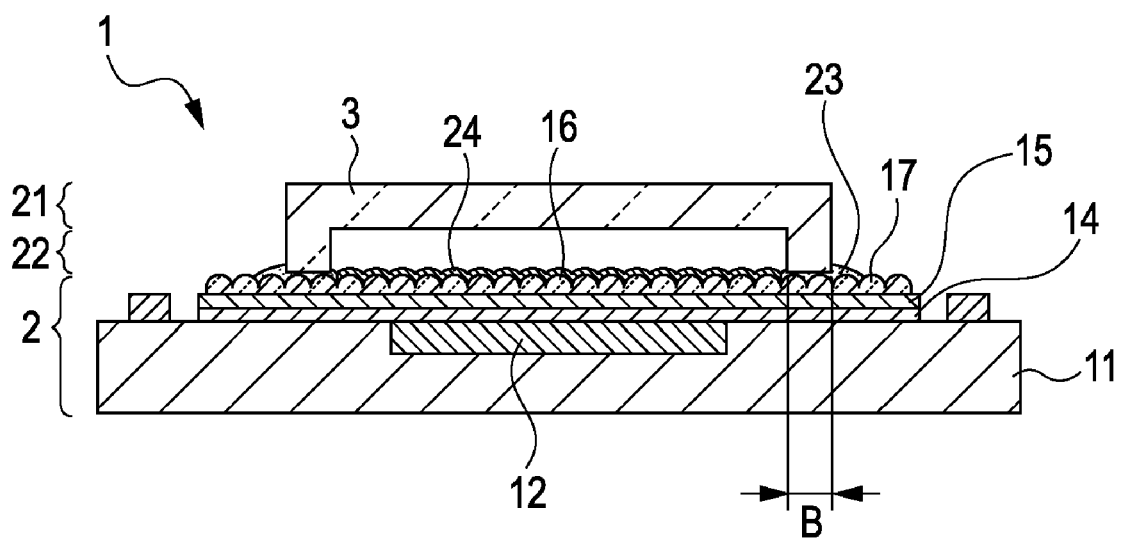
FIG. 6 is a sectional view of a solid-state image pickup device according to an embodiment of the present invention.

Next, a fourth embodiment is described. FIG. 6 is a sectional view of a solid-state image pickup device according to the fourth embodiment.

The solid-state image pickup device 1 illustrated in FIG. 6 differs from the solid-state image pickup device 1 of the first embodiment in that a water-repellent portion is provided on a surface of the first concavo-convex portion inside (the pixel region side) the frame portion. A water-repellent material is applied to a surface of the first concavo-convex portion 16 to become the microlenses facing the pixel region 12, while the water-repellent material is not applied to surfaces of the second and third concavo-convex portions outside the fixing region B. In this case, infiltration of the fixing member 23 into a region corresponding to the pixel region 12 can be suppressed. In a method of manufacturing the solid-state image pickup device 1, in the step of preparing the solid-state image pickup element 2, the solid-state image pickup element 2 including the first concavo-convex portion 16 configured as described above is prepared. With this configuration, the fixing member is infiltrated into a region outside the fixing region B, whereby infiltration of the fixing member into a region corresponding to the pixel region can be suppressed. Therefore, the solid-state image pickup device can be reduced in size.

Figure 7A:
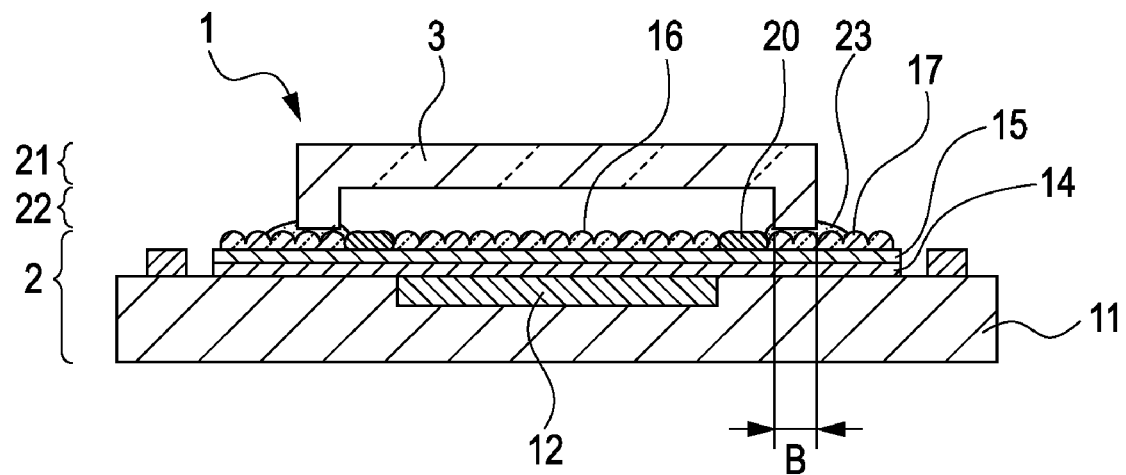
FIG. 7A is a sectional view.

Next, a fifth embodiment is described. FIG. 7A is a sectional view, and FIG. 7B is a plan view of a solid-state image pickup device according to the fifth embodiment.

Figure 7B:
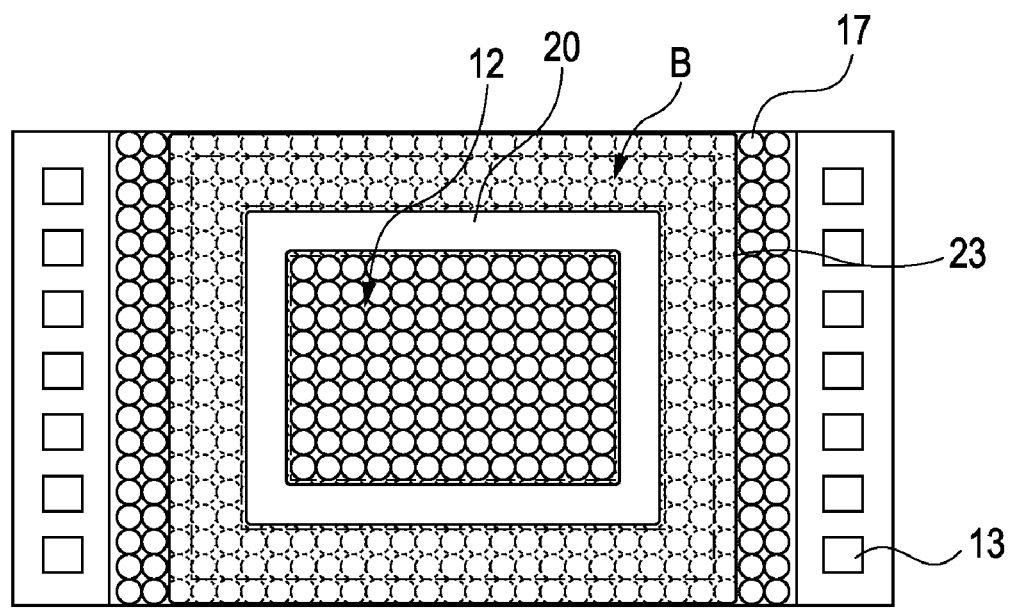
FIG. 7B is a plan view of a solid-state image pickup device according to an embodiment of the present invention.

The solid-state image pickup device 1 illustrated in FIGS. 7A and 7B differs from the solid-state image pickup device 1 of the first embodiment in that a bank portion is disposed inside (the pixel region side) the frame portion, the bank portion constituted by a continuous convex portion surrounding the pixel region. Thus, the fixing member 23 does not contact the first concavo-convex portion 16 to become the microlenses in the pixel region 12 at which capillary action occurs. Therefore, infiltration of the fixing member 23 into a region corresponding to the pixel region 12 can be suppressed. In a method of manufacturing the solid-state image pickup device 1, in the step of preparing the solid-state image pickup element, the solid-state image pickup element including a bank portion 20 configured as described above is prepared. With this configuration, the fixing member 23 infiltrates into a region outside the fixing region B, whereby infiltration of the fixing member 23 into the pixel region 12 can be suppressed. Therefore the solid-state image pickup device can be reduced in size.

The first concavo-convex portion 16 corresponding to the pixel region 12, the bank portion 20 surrounding the pixel region 12, the third concavo-convex portion 18 corresponding to the fixing region B to which the frame portion 22 is fixed, and the second concavo-convex portion 17 corresponding to a region outside the frame portion 22 can be formed in the same step. Therefore, a benefit is obtained in that the solid-state image pickup device according to the embodiment can be manufactured without increasing the number of steps and the cost.

Figure 8A:
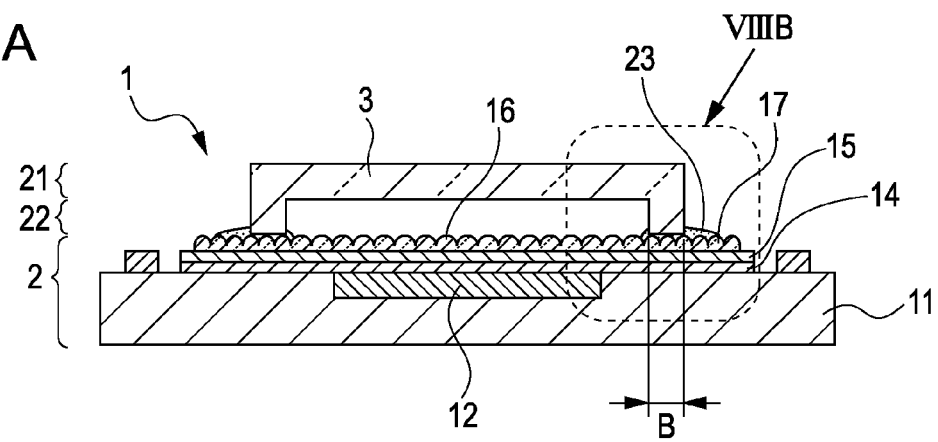
FIGS. 8A and 8B are sectional views.

Next, a sixth embodiment is described. FIG. 8A is a sectional view, FIG. 8B is an enlarged sectional view of an area defined by line VIIIB of FIG. 8A, and FIG. 8C is a plan view of a solid-state image pickup device according to the sixth embodiment.

Figure 8B:
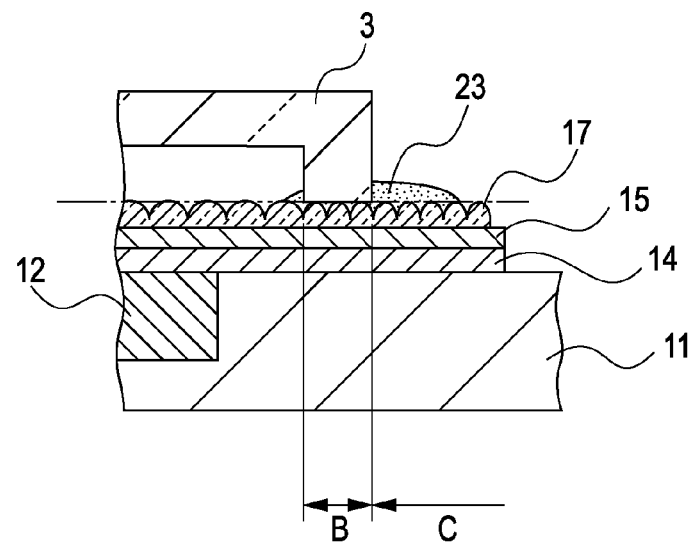
Figure 8C:
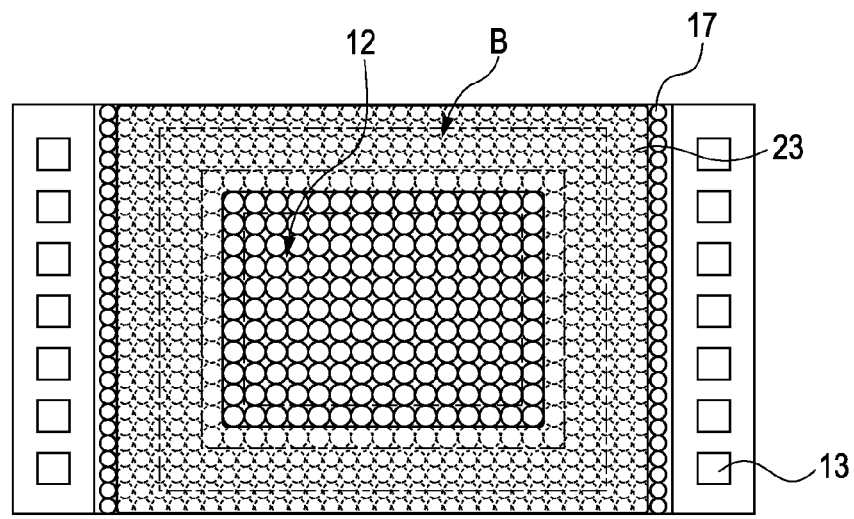
FIG. 8C is a plan view of a solid-state image pickup device according to an embodiment of the present invention.

The solid-state image pickup device 1 illustrated in FIGS. 8A, 8B, and 8C differs from the solid-state image pickup device 1 of the first embodiment in that the second and third concavo-convex portions, which correspond to the fixing region B and a region outside the fixing region B, has a smaller pitch than that of the first concavo-convex portion 16 corresponding to the pixel region 12. That is, an area between adjacent convex portions in the second and third concavo-convex portions is smaller that that of an area between adjacent convex portions in the first concavo-convex portion, because the diameter of convex portions and the distance between adjacent convex portions are smaller. In other words, in a section perpendicular to the principal surface of the substrate, the average of minimum sectional areas of the concave portions in the second and third concavo-convex portions is smaller than the average of minimum sectional areas of the concave portions in the first concavo-convex portion. Referring to FIG. 8B, in side view, the minimum sectional area refers to an area of a region defined by the two-dot chain line and profile lines of adjacent concave portions in a vertical section including a line connecting peaks of the adjacent concave portions. If the peaks of the convex portions are off the vertical section, the sectional area becomes larger than when the peaks are in the vertical section. As long as the average of minimum sectional areas of the concave portions in the second concavo-convex portion is smaller than that of the first concavo-convex portion, even if the average of minimum sectional areas of the concave portions in the third concavo-convex portion is about the same as that of the first concavo-convex portion, the fixing member can easily infiltrate into the second concavo-convex portion. The same applies to the relation between diameters of the convex portions and to the relation between the distances between adjacent convex portions described above. Therefore, the fixing member 23 can easily infiltrate into a region outside the pixel region 12, whereby infiltration of the fixing member 23 into a region corresponding to the pixel region 12 can be suppressed. In a method of manufacturing the solid-state image pickup device 1, in the step of preparing the solid-state image pickup element, a solid-state image pickup element including microlenses configured as described above is prepared. With this configuration, the fixing member 23 can easily infiltrate into regions excluding the pixel region, whereby infiltration of the fixing member 23 into a region corresponding to the pixel region 12 is suppressed. Therefore, the solid-state image pickup device can be reduced in size.

The microlenses 16 corresponding to the pixel region 12 and the microlenses corresponding to regions excluding the pixel region can be formed in the same step. Therefore, a benefit is obtained in that the solid-state image pickup device according to the embodiment can be manufactured without increasing the number of steps and the cost.

Moreover, when forming the microlenses by heating and melting, since the microlenses have the same structure from the pixel region to the region facing the frame portion, the microlenses in the pixel region can be uniformly formed in a desirable shape.

Figure 9A:
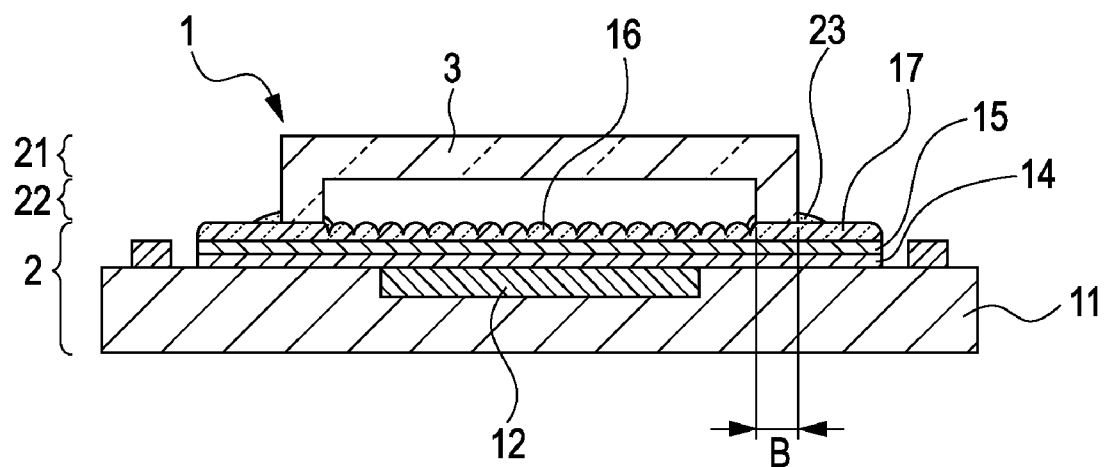
FIG. 9A is a sectional view.
Figure 9B:
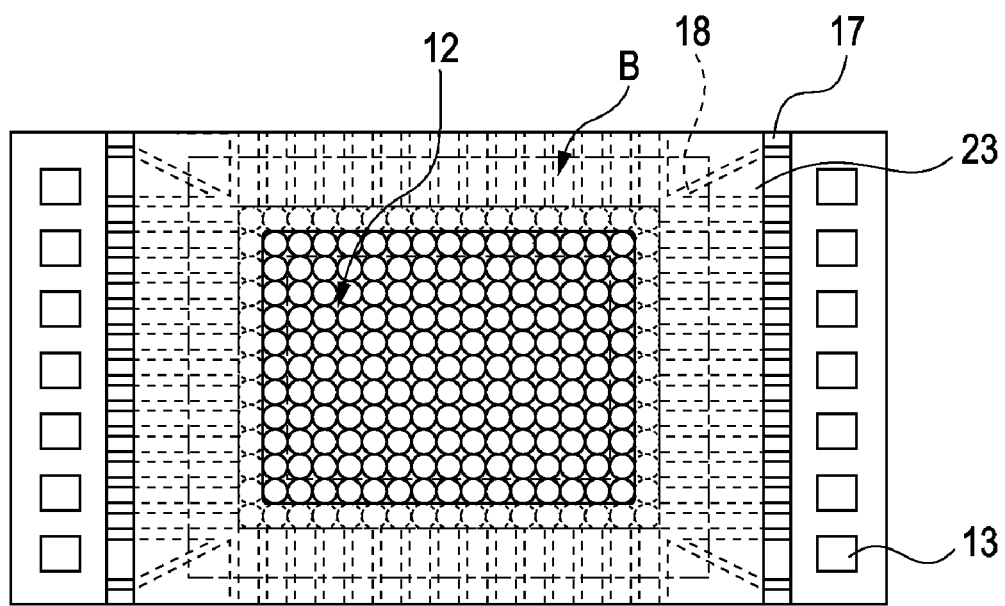
FIG. 9B is a plan view of a solid-state image pickup device according to an embodiment of the present invention.

Next, a seventh embodiment is described. FIG. 9A is a sectional view, and FIG. 9B is a plan view of a solid-state image pickup device according to the seventh embodiment.

The solid-state image pickup device 1 illustrated in FIG. 9 differs from the solid-state image pickup device 1 of the first embodiment in that strip-shaped convex portions are disposed in regions excluding the pixel region. In the case of the strip-shaped convex portions, as described above, the average of minimum sectional areas of concave portions in the second concavo-convex portion may be smaller than the average of minimum sectional areas of concave portions in the first concavo-convex portion. In the case of the strip-shape convex portions, the minimum sectional area of the second concavo-convex portion refers to an area defined by a concave portion (groove) in a vertical section extending in a direction perpendicular to the concave portion. In this way, not only the microlens shape but any other shapes can be used in order to cause capillary action in regions excluding the pixel region so as to suppress infiltration of the fixing member 23 into a region corresponding to the pixel region 12. In a method of manufacturing the solid-state image pickup device 1, in the step of preparing the solid-state image pickup element, a solid-state image pickup element including the second and third concavo-convex portions as described above is prepared. With this configuration, the fixing member 23 can easily infiltrate into regions excluding the pixel region, so that infiltration of the fixing member 23 into a region corresponding to the pixel region 12 can be suppressed, whereby the solid-state image pickup device can be reduced in size.

The first concavo-convex portion 16 that serves as the microlenses 16 corresponding to the pixel region 12 and the strip-shaped concavo-convex portion corresponding to regions excluding the pixel region can be formed in the same step. Therefore, a benefit is obtained in that the solid-state image pickup device according to the present embodiment can be manufactured without increasing the number of steps and the cost. Moreover, when forming the microlenses by heating and melting, since the microlenses have the same structure from the pixel region to the region facing the frame portion, the microlenses in the pixel region can be uniformly formed in a desirable shape.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-324403 filed Dec. 19, 2008, which is hereby incorporated by reference herein in its entirety.

What is claimed is:

1. A method comprising:
preparing a cover member;
preparing an image pickup element including a substrate including a pixel region including a plurality of photo detectors on a principal surface, a first concavo-convex portion including a plurality of first convex portions configured to concentrate light on the plurality of photo detectors, the first convex portions each having a lens shape, and a second concavo-convex portion surrounding the first concavo-convex portion, the second concavo-convex portion including a plurality of second convex portions; and
fixing the cover member to a region of the image pickup element using a fixing member, the region being between the first concavo-convex portion and the second concavo-convex portion.

2. The method according to claim 1,
wherein, in a section perpendicular to the principal surface, an average of minimum sectional areas of second concave portions of the second concavo-convex portion is smaller than an average of minimum sectional areas of first concave portions of the first concavo-convex portion, the second concave portions respectively position between the plurality of the second convex portions, and the first concave portions respectively position between the plurality of the first convex portions.

3. The method according to claim 1, wherein the plurality of second convex portions have lens shapes.

4. The method according to claim 1,
wherein the plurality of second convex portions have strip shapes.

5. The method according to claim 1,
wherein the first concavo-convex portion and the second concavo-convex portion are integrally formed.

6. The method according to claim 1,
wherein the preparing the image pickup element includes forming a flat portion in a region between the first concavo-convex portion and the second concavo-convex portion.

7. The method according to claim 1,
wherein the preparing the image pickup element includes forming a third concavo-convex portion in a region between the first concavo-convex portion and the second concavo-convex portion, the third concavo-convex portion including a plurality of third convex portions.

8. The method according to claim 7,
wherein the plurality of third convex portions have strip shapes.

9. The method according to claim 1,
wherein the preparing the image pickup element includes disposing a color filter between the first concavo-convex portion and the substrate, the color filter not being disposed in the region to which the cover member is fixed.

10. The method according to claim 1,
wherein the preparing the image pickup element includes surrounding a periphery of the first concavo-convex portion with a bank portion.

11. The method according to claim 1,
wherein the preparing the image pickup element includes forming a water-repellent portion on the first concavo-convex portion.

12. The method according to claim 1,
wherein the fixing member includes an adhesive.

13. The method according to claim 1,
wherein the first concavo-convex portion positions above the pixel region and the second concavo-convex portion positions above a region outside the pixel region.

14. A method comprising:
preparing a cover member;
preparing an image pickup element including a substrate including a pixel region including a plurality of photo detectors on a principal surface, a first concavo-convex portion including a plurality of first convex portions configured to concentrate light on the plurality of photo detectors, the first convex portions each having a lens shape, and a second concavo-convex portion surrounding the first concavo-convex portion, the first concavo-convex portion being configured to allow an applied adhesive to infiltrate into the first concavo-convex portion by capillary action at the first concavo-convex portion, and the second concavo-convex portion being configured to allow the applied adhesive to infiltrate into the second concavo-convex portion by capillary action occurring at the second concavo-convex portion a force of the capillary action at the second concavo-convex portion being equal to or larger than a force of the capillary action at the first concavo-convex portion, by which the applied adhesive infiltrates into the first concavo-convex portion; and
fixing the cover member to the image pickup element by placing the cover member on a region of the image pickup element with an adhesive therebetween, the region being between the first concavo-convex portion and the second concavo-convex portion, by infiltrating a part of the adhesive into the second concavo-convex portion, and by subsequently curing the adhesive.

15. The method according to claim 14,
wherein the fixing member includes an adhesive.

16. The method according to claim 14,
wherein the first concavo-convex portion positions above the pixel region and the second concavo-convex portion positions above a region outside the pixel region.

17. A solid-state image pickup device comprising:
an image pickup element including a pixel region including a plurality of photo detectors on a principal surface and a first concavo-convex portion including lenses configured to concentrate light on the plurality of photo detectors; and
a cover member covering the first concavo-convex portion, the cover member being fixed to the image pickup element using a fixing member,
wherein the image pickup element includes a second concavo-convex portion disposed in a periphery of the first concavo-convex portion and outside a region facing the cover member, the second concavo-convex portion having a surface covered with a part of the fixing member.

18. The device according to claim 17, further comprising:
a wiring substrate fixed to a side of the image pickup element opposite a side to which the cover member is fixed;

a conductor configured to transfer a signal between the image pickup element and the wiring substrate; and a sealing member sealing a periphery of the cover member and the conductor.

19. The apparatus according to claim 17, wherein the first concavo-convex portion and the second concavo-convex portion are integrally formed.

20. The apparatus according to claim 17, wherein the image pickup element includes a flat portion in a region formed between the first concavo-convex portion and the second concavo-convex portion.

21. The apparatus according to claim 17, wherein the image pickup element includes a third concavo-convex portion formed in a region between the first concavo-convex portion and the second concavo-convex portion, the third concavo-convex portion including a plurality of third convex portions.

22. The apparatus according to claim 21, wherein the plurality of third convex portions have strip shapes.

23. The apparatus according to claim 17, wherein the second concavo-convex portion includes a plurality of convex portions having one of lens shapes and strip shapes.

24. The apparatus according to claim 17, wherein the image pickup element includes a bank portion surrounding a periphery of the first concavo-convex portion.

25. The apparatus according to claim 17, wherein the fixing member includes an adhesive.

26. The apparatus according to claim 17, wherein the first concavo-convex portion positions above the pixel region and the second concavo-convex portion positions above a region outside the pixel region.

* * * * *